United States Patent
Rick et al.

[11] Patent Number: 6,056,826
[45] Date of Patent: May 2, 2000

[54] VACUUM COATING DEVICE FOR COATING SUBSTRATES ON ALL SIDES

[75] Inventors: Alfred Rick, Karlstein; Helmut Eberhardt, Gründau; Friedrich Anderle, Hanau; Martin Bähr, Nidderau, all of Germany

[73] Assignee: Leybold Systems, GmbH, Hanau, Germany

[21] Appl. No.: 09/118,078

[22] Filed: Jul. 17, 1998

[30] Foreign Application Priority Data

Jul. 18, 1997 [DE] Germany ............................ 197 30 993

[51] Int. Cl.[7] .................................................. C23C 16/00
[52] U.S. Cl. ............................................. 118/730; 118/500
[58] Field of Search ...................... 118/730, 500

[56] References Cited

U.S. PATENT DOCUMENTS

| | | | |
|---|---|---|---|
| 3,783,822 | 1/1974 | Wollam | 118/730 |
| 4,108,107 | 8/1978 | Scheuermann | 118/49.1 |
| 4,192,253 | 3/1980 | Aichert et al. | 118/712 |
| 5,558,909 | 9/1996 | Poliquin | 118/730 |

FOREIGN PATENT DOCUMENTS

| | | | |
|---|---|---|---|
| 2813180 | 10/1979 | Germany. | |
| 29505497.2 | 7/1995 | Germany. | |
| 62-139878 | 6/1987 | Japan | 118/730 |

*Primary Examiner*—Richard Bueker
*Attorney, Agent, or Firm*—Smith, Gambrell & Russell, LLP

[57] ABSTRACT

A vacuum coating device coats substrates on all sides by rotating the substrates in a material flow. The device is for use in a vacuum chamber with a material source, and includes a holder for holding the substrates opposite the material source and drives correlated with the holder to bring about a rotation and shifting movement of the substrates. The device includes a hollow manipulator arm formed from three legs which extend at an angle with respect to one another. More specifically, the first leg extends at an obtuse angle with respect to the second leg, and the second leg extends at an approximately right-angle with respect to the third leg. The substrates are then held at the end of the third leg by the holder. The manipulator arm, when driven by a motor, can rotate around the longitudinal axis of the first leg, and, moreover, can move back and forth in the direction of this longitudinal axis. The holder includes a planetary gear system and substrate holders, which are made to rotate by the planetary gear system.

21 Claims, 2 Drawing Sheets

VACUUM COATING DEVICE FOR COATING SUBSTRATES ON ALL SIDES

This application is based upon German Patent Application No. 197 30 993.3, filed in Germany on Jul. 18, 1997, which German patent application is incorporated entirely herein by reference.

BACKGROUND OF THE INVENTION

1. Field of the Invention

The invention relates to a vacuum coating unit to coat substrates on all sides by rotating the substrates in a material flow. The invention can be employed with various methods of vacuum deposition, including cathodic sputtering, ion plating, CVD (chemical vapor deposition), and other related methods.

2. Description of the Related Art

A method is known for providing substrates with a thin surface layer on all sides by subjecting them to a rotational movement within a directed vapor flow and/or by conducting them through the vapor flow while executing a rotational movement. For this purpose, the substrates can be individually mounted on shafts and brought into the vapor flow as the substrates rotate around the shaft axis. For the purpose of driving the shafts, coggears or rollers, which roll on a stationary toothed rack or rail, are affixed to the ends of the shafts. Resistance layers were already applied, in the indicated manner, on tubular insulators.

A method also is already known for affixing geometrically simple substrates, such as optical lenses and filters, on substrate holders and conducting them through a vapor flow while periodically executing complicated compound movements. Such devices or methods are suitable only for relatively small substrates whose profiling does not cause any problems with respect to a uniform layer thickness distribution.

For the purpose of vapor deposition onto relatively complicated parts, such as headlight reflectors for motor vehicle headlights, a method is already known for positioning the substrates on substrate holders which are arranged so they can rotate in an essentially cylindrical cage. The vaporizer source is located in the interior of the cage, so that, with one rotation of the cage, the substrates are moved through the vapor flow (which is directed upwards). The substrate holders then carry out an additional rotation within the cage because of a superimposed drive, which can be described as an involute movement. In this manner, a rather good layer thickness distribution is attained according to the law of chance. For extremely irregular shaped substrates of larger dimensions, however, which are to be subjected to vapor deposition in batches with high-melting metals or metal alloys, and wherein the substrate temperatures are to be above, for example, 555° C., such a device is not suitable.

Substrates that are geometrically shaped in a particularly complicated manner, for which even greater importance is placed on a uniform layer thickness distribution, distribution of the alloy elements in the layer, and a great adhesive strength by intermetallic diffusion, are, for example, turbine buckets for gas turbines, as they are used in aviation. The problems connected with surface layers on such turbine buckets are described in the company publication "High Temperature Resistant Coatings for Super-Alloy" by Richard P. Seeling and Dr. Richard J. Stueber from the Chromalloy American Corporation, New York, USA. It has been extraordinarily difficult up to now to produce such substrates having layers with the required characteristics on a large industrial scale and at economically justifiable prices. Special problems associated with vapor deposition for substrates having geometrically complicated shapes are the transfer of a defined rotation from a driving motor to the substrate and the relatively high losses of expensive vapor deposition material, which does not condense on the substrate, but rather on the inside surfaces of the vapor deposition unit causing disruptive deposits. This problem can be counteracted by a spatially narrow arrangement of the substrate in the vapor flow or above the vaporizer crucible, but only to a certain extent.

A vapor deposition unit for the coating of substrates on all sides by rotating the substrates in a material flow also is known and is disclosed in West German Patent No. 2,813,180. This unit consists of a vacuum chamber with an elongated material source having a longitudinal axis and a transverse axis. The unit also has a substrate holder with several fasteners for the flat arrangement of several substrates above the material source. More specifically, the substrate holder has two parallel carrier arms arranged in the shape of a fork, whose longitudinal axes are arranged mirror-symmetrically to a vertical symmetric plane passing through the longitudinal axis of the material source. The substrate holder also has couplings for the substrates, which are arranged on the interior sides of the carrier arms set on one another. The rotation axes of the couplings are aligned vertical to the symmetric plane, and a driving shaft is correlated with each of the carrier arms in their longitudinal direction, each driving shaft being connected via angular gears with couplings, on the one hand, and with a motor, on the other hand.

Lastly, a device for the coating of three-dimensional substrates with comparatively large dimensions, such as gear rims for automobile tires, is known and disclosed in U.S. Pat. No. 5,558,909. In this device, two substrates are arranged on a carrier, which pivots in the coating chamber and which has a Z-shaped middle part bent at right angles. The substrates are mounted on shafts on one of the right-angle bends running at an incline with respect to the rotational axis of the carrier. The shafts, in turn, extend at right angles to this right-angle bend, and are held by the right-angle bend and driven by a motor. During the coating process, the substrate carrier rotates, whereby the substrates mounted on the shafts rotate around the substrate carrier axis and, further, rotate around their own inclined longitudinal axes.

OBJECTS AND BRIEF SUMMARY OF THE INVENTION

The goal of the invention is to provide a vacuum coating unit of the kind described above, which makes it possible to provide several complicatedly shaped substrates, such as turbine buckets, with metal or oxidic surface layers in a particularly uniform manner.

The vacuum coating unit according to the invention is employed in a vacuum chamber for holding a material source, and includes a substrate holder for holding the substrates opposite the material source and a drive correlated with the substrate holder for the production of a rotation and a displacement movement of the substrates. The unit also has a hollow arm or extension subdivided into three legs, each leg extending at an angle with respect to one another. In particular, the first leg of the arm is formed at an obtuse angle with respect to the second leg, and the second and third legs are joined together at a knee which forms approximately a right angle.

The substrates are held at the end of the third leg, such that the longitudinal axis of the first leg approximately intersects the center of the space where the substrates are held. The arm is driven by a motor around the longitudinal axis of the first leg in a rotating manner and, moreover, can be moved back and forth over a predetermined distance in the direction of this longitudinal axis. The substrates are connected with a shaft in a rotary-stationary ("drehfest") manner, while the shaft is constructed as a propeller (i.e., a universal drive) shaft or as a flexible shaft and is conducted through the hollow extension along the longitudinal axis of each leg. The free end of the shaft is operatively connected with a motor.

In order to attain the formulated goal in accordance with the invention, the shaft is coupled with the motor on one end and is firmly joined with the planet carrier of a planetary gear system on the other end. Also, the free end of the third leg of the hollow extension is provided with the sun gear of the planetary gear system, which supports and engages the planet gears. The axis of each planet gear is then firmly connected with a substrate holder.

BRIEF DESCRIPTION OF THE DRAWINGS

The invention permits a variety of embodiments. One preferred embodiment of the invention is represented in more detail, in a purely schematic way, in the appended drawings, which show the following:

FIG. 3 illustrates a top view of the planet gear and the substrate holders with the turbine buckets affixed on them in accordance with the embodiment shown in FIGS. 1 and 2.

DETAILED DESCRIPTION OF A PREFERRED EMBODIMENT

One preferred embodiment of the invention will now be described in detail, referring to FIGS. 1–3.

Figure 1:
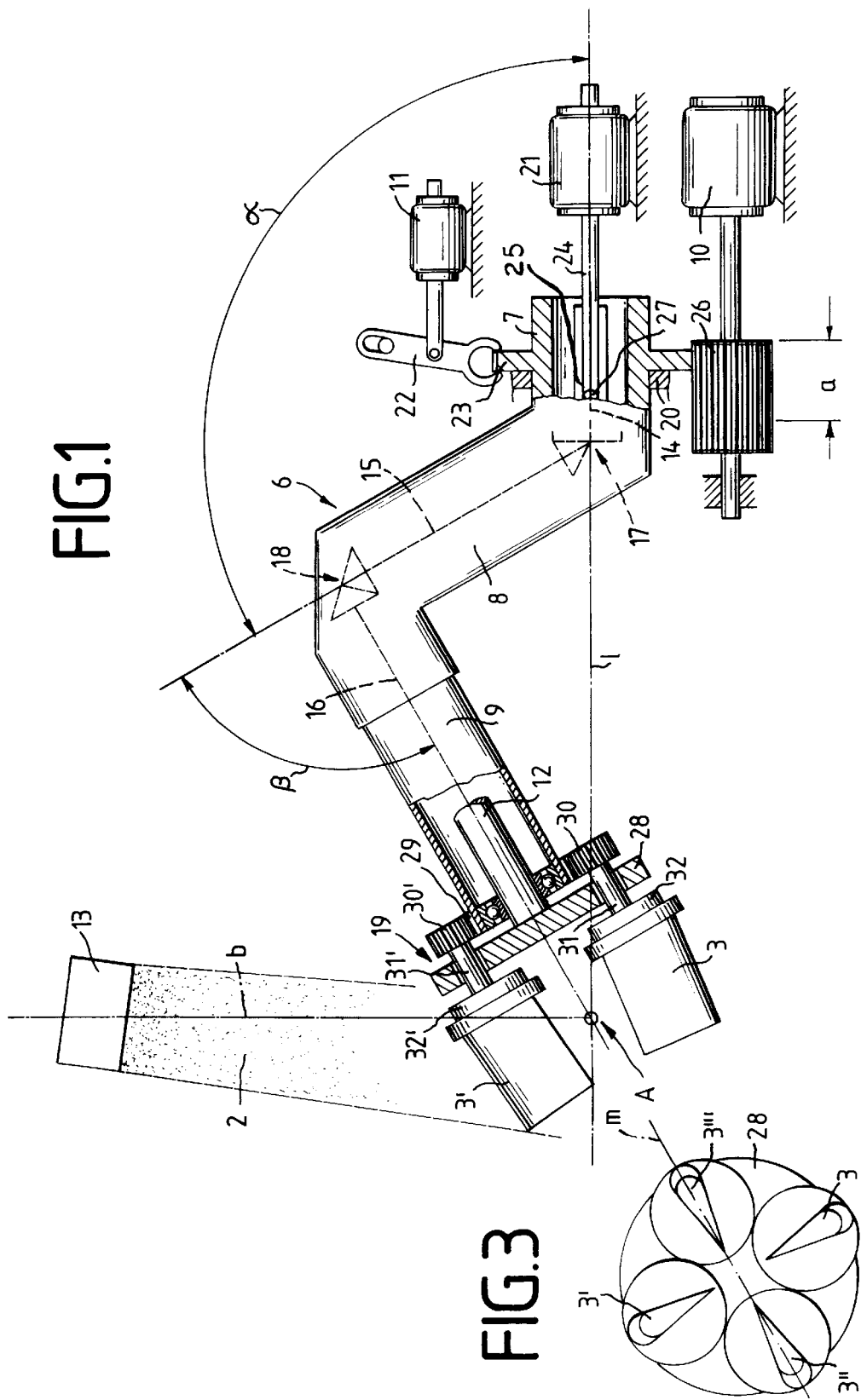
FIG. 1 illustrates the vacuum coating unit with a manipulator arm for holding four turbine buckets in a side view.
Figure 2:
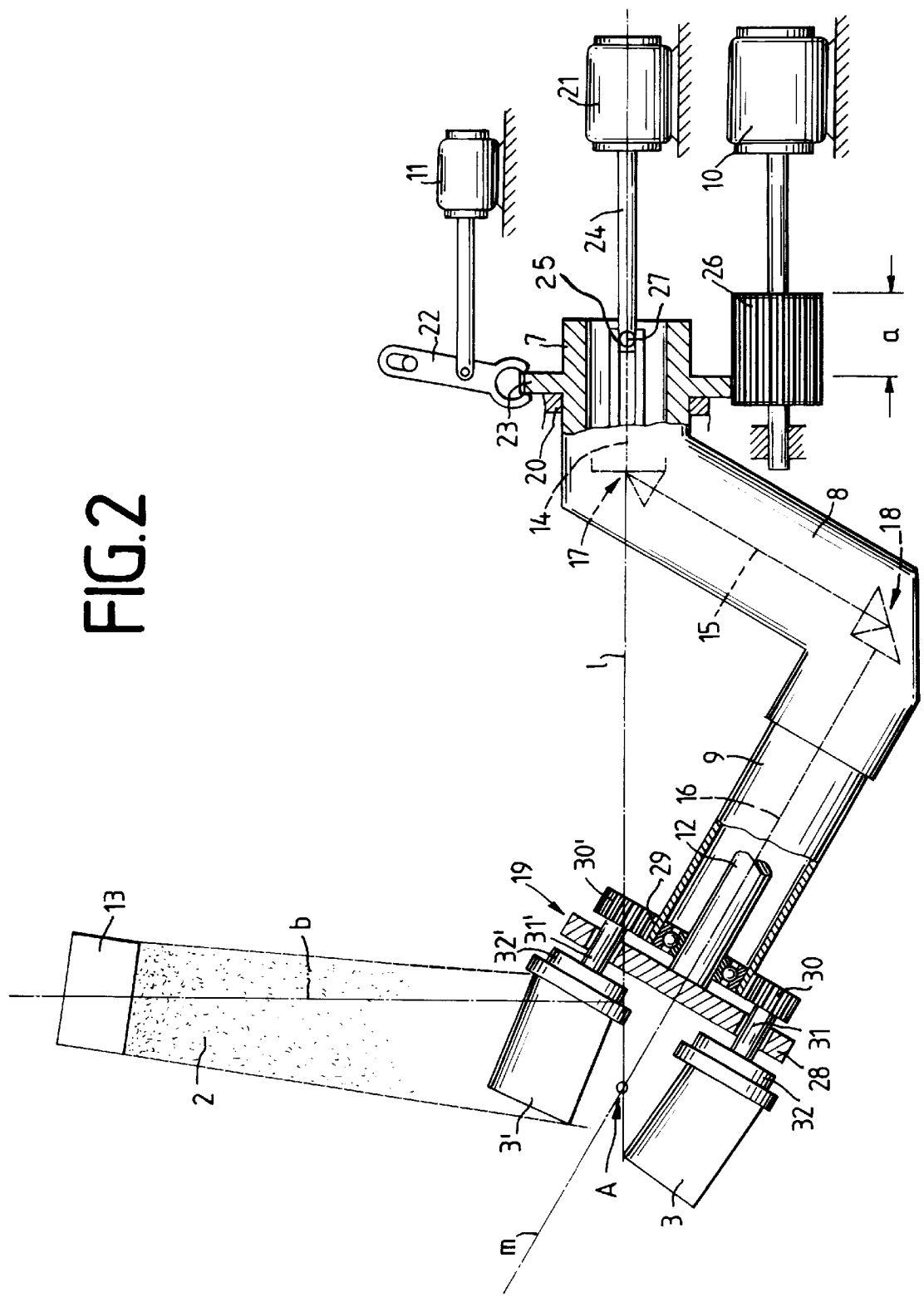
FIG. 2 illustrates the embodiment of the unit shown in FIG. 1, but with the manipulator arm swiveled by 90°.

As shown in FIGS. 1 and 2, a coating source 13 is situated stationary in a vacuum chamber, which is not depicted in detail. The coating source is suitable for coating the substrates 3, 3', 3", 3'"—in the represented case, four turbine buckets—with a wear-resistant and/or heat-resistant layer of material. To ensure that the coating is carried out in a uniform manner, the substrates 3, 3', 3", 3'" are affixed on a substrate holding device, which includes a hollow manipulator arm 6 having three legs 7, 8, and 9. The first two legs 7, 8 are connected at an obtuse angle α with respect to one another, while the second and third legs 8, 9 are connected at a right angle β with respect to one another.

The legs 7, 8, 9 are constructed as hollow sections, which are joined firmly with one another or are constructed as an integral unit. A multipart driving shaft (formed from shaft links 14, 15, 16) passes through longitudinal boreholes in the three legs 7, 8, 9. (A detailed illustration of a section of shaft 16 is identified in FIGS. 1 and 2 by reference numeral 12.) The individual links of the shaft 14 are operatively connected by pairs of angular gears 17, 18. The shaft 14 is driven by a motor 21, whose rotations are transferred via the multipart shaft 14, 15, 16 to a holder 19 which holds the substrates 3, 3', 3", 3'".

The holder 19 is connected to shaft 14, and includes a planetary gear system with a planet carrier 28 and four planet gears 30, 30', 30", 30'". The planet carrier 28 is connected in a stationary manner with the shaft 16, so that the planet carrier 28 turns with the shaft 16. The four planet gears 30, 30', 30", 30'" are supported on the planet carrier 28 in a rotatable manner, and each planet gear 30, 30', 30", 30'" engages a toothed sun gear 29 fixed on the end of the third leg 9 of the manipulator arm 6. Also, each planet gear 30, 30', 30", 30'" is coupled with a substrate holder 32, 32', 32", 32'" through a shaft 31, 31', 31", 31'".

At the opposite end of the manipulator arm 6, the leg 7 is supported on a frame 20 in a rotatable manner. The leg 7 also has a toothed gear 23 fixedly mounted thereon, which in turn is coupled with a pinion 26. The pinion 26 is connected to a motor 10 through a shaft, so that the manipulator arm 6 can be rotated about axis 1 with the aid of the motor 10. For this reason, the manipulator arm 6 can assume the positions depicted in FIGS. 1 and 2.

In addition, the manipulator arm 6 can be shifted by a distance "a" in a direction parallel to axis 1. Thus, the center of gravity A of the substrates 3, 3', 3", 3'" can be shifted by this distance a. In order to allow this shift of the manipulator arm 6 (and thus the substrates 3, 3', 3", 3'"), a motor operator 11 is provided parallel to axis 1. The motor operator 11 moves a swiveling lever 22 via a rod, and the connecting link of this lever overlaps the toothed gear 23 and correspondingly shifts it. The shaft 24 of the motor 21 has a notched portion 27 which engages a slot 25 in the shaft 14 via a lifting cog, and is thus in operative connection with the multipart shaft 14, 15, 16. In this manner, the shaft 24 of motor 21 transfers its rotation to the substrates 3, 3', 3", 3'", which are held by the substrate holders 32, 32', 32", 32'". Accordingly, opposite the operative axis b from the stationary coating source 13, the substrates 3,3',3",3'" can be shifted transversely by the extent a and thereby simultaneously also rotated around the axis m. Further, as will be understood from the description above, each substrate is also rotated about its own axis by the action of the planet gears 30, 30', 30", 30'".

As discussed above and shown in FIGS. 1 and 2, the substrates 3, 3', 3", 3'" can be shifted and turned in such a way with respect to coating source 13 that all parts of the jacket surfaces of the substrates can be uniformly coated by particle flow 2 of source 13. It is clear that instead of the four substrates 3, 3', 3", 3'" indicated in FIG. 3, another number of substrates can also be provided, if the planetary gear system or its planet carrier 28 is provided with a corresponding number of planet gears and substrate holders.

List Of Reference Numbers

2 Material flow, particle flow
3,3', . . . Substrate
6 Manipulator arm
7 Leg
8 Leg
9 Leg
10 Motor
11 Motor
12 Shaft
13 Coating source
14 Shaft, link
15 Shaft, link
16 Shaft, link
17 Angular gear pair
18 Angular gear pair
19 Holder
20 Frame
21 Motor
22 Lever, shifting claw 23 Toothed gear
24 Shaft
25 Slit
26 Pinion
27 Shift sleeve, multinotch shaft
28 Planet carrier
29 Gear-tooth system
30,30', . . . Planet gear
31,31', . . . Gear axis
32,32', . . . Substrate holder

We claim:

1. A vacuum coating device for coating substrates on all sides, by moving the substrates in a particle flow, comprising:
   a substrate holder, a portion of which is positioned opposite the material source, wherein the substrate holder includes:
   a first leg having a first longitudinal axis,
   a second leg having a second longitudinal axis, wherein the second leg extends from the first leg at an obtuse angle,
   a third leg having a third longitudinal axis, wherein the third leg extends from the second leg,
   a planet carrier mounted at an end of the third leg opposite the second leg, and
   a plurality of substrate shafts extending from the planet carrier on which substrates may be mounted for coating,
   wherein the planet carrier and substrate shafts are positioned such that the first longitudinal axis of the first leg approximately intersects a central area where the substrates are held; and
   a drive mechanism for moving the substrate holder, wherein the drive mechanism:
   (a) rotates the substrate holder around the first longitudinal axis,
   (b) linearly shifts the substrate holder along the first longitudinal axis,
   (c) rotates the planet carrier about the third longitudinal axis, and
   (d) rotates the substrate shafts with respect to the planet carrier.

2. A vacuum coating device according to claim 1, wherein:
   the drive mechanism includes a first motor with a driving shaft parallel to the first longitudinal axis, and
   the first leg of the substrate holder includes an outer jacket surface having a gear-tooth system, wherein the outer jacket is cylindrical at least in sections and the gear-tooth system engages a pinion of the driving shaft of the first motor.

3. A vacuum coating device according to claim 2, wherein the drive mechanism includes a second motor with a second driving shaft,
   the planet carrier is connected with a first end of a third driving shaft, and
   a second end of the third driving shaft is connected with the second driving shaft of the second motor to rotate the planet carrier about the third longitudinal axis.

4. A vacuum coating device according to claim 3, wherein each substrate shaft includes a planet gear rotatably engaged with a sun gear circumferentially positioned around the third leg of the substrate holder.

5. A vacuum coating device according to claim 3, wherein the drive mechanism includes a third motor connected to a shifting claw, wherein the shifting claw connects with the first leg, and when the shifting claw is moved by the third motor, the substrate holder is linearly shifted along the first longitudinal axis.

6. A vacuum coating device according to claim 2, wherein the drive mechanism includes a second motor connected to a shifting claw, wherein the shifting claw connects with the first leg, and when the shifting claw is moved by the second motor, the substrate holder is linearly shifted along the first longitudinal axis.

7. A vacuum coating device according to claim 6, wherein each substrate shaft includes a planet gear rotatably engaged with a sun gear circumferentially positioned around the third leg of the substrate holder.

8. A vacuum coating device according to claim 2, wherein each substrate shaft includes a planet gear rotatably engaged with a sun gear circumferentially positioned around the third leg of the substrate holder.

9. A vacuum coating device according to claim 1, wherein:
   the drive mechanism includes a first motor with a first driving shaft, and
   the planet carrier is connected with a first end of a second driving shaft, and a second end of the second driving shaft is connected with the first driving shaft of the first motor to rotate the planet carrier about the third longitudinal axis.

10. A vacuum coating device according to claim 1, wherein the drive mechanism includes a first motor connected to a shifting claw, wherein the shifting claw connects with the first leg such that, when the shifting claw is moved by the first motor, the substrate holder is linearly shifted along the first longitudinal axis.

11. A vacuum coating device according to claim 1, wherein each substrate shaft of the substrate holder includes a planet gear rotatably connected with the third leg of the substrate holder.

12. A vacuum coating device for coating substrates, comprising:
    a substrate holder which includes:
    a first leg having a first longitudinal axis,
    a second leg having a second longitudinal axis, wherein the second leg extends at an angle with respect to the first leg,
    a third leg having a third longitudinal axis, wherein the third leg extends at an angle with respect to the second leg,
    a planet carrier mounted at a first end of the third leg, and
    a plurality of substrate shafts on which substrates may be mounted for coating extending from the planet carrier; and
    a drive mechanism for moving the substrate holder, wherein the drive mechanism:
    (a) rotates the planet carrier about the third longitudinal axis, and
    (b) rotates the substrate shafts with respect to the planet carrier.

13. A vacuum coating device according to claim 12, wherein the planet carrier is connected with a first end of a shaft, and a second end of the shaft is connected with a driving shaft of a motor to rotate the planet carrier about the third longitudinal axis.

14. A vacuum coating device according to claim 12, wherein each substrate shaft includes a planet gear rotatably engaged with a sun gear circumferentially positioned around the third leg of the substrate holder.

15. A vacuum coating device according to claim 12, wherein the drive mechanism includes a first motor with a driving shaft parallel to the first longitudinal axis, and the first leg of the substrate holder includes an outer jacket surface having a gear-tooth system, wherein the outer jacket is cylindrical at least in sections and the gear-tooth system engages a pinion of the driving shaft of the motor.

16. A vacuum coating device according to claim 12, wherein the drive mechanism further linearly shifts the substrate holder along the first longitudinal axis.

17. A vacuum coating device according to claim 16, wherein the drive mechanism includes a motor connected to a shifting claw, wherein the shifting claw connects with the first leg, and when the shifting claw is moved by the motor, the substrate holder is linearly shifted along the first longitudinal axis.

18. A vacuum coating device according to claim 12, wherein the drive mechanism further rotates the substrate holder around the first longitudinal axis.

19. A vacuum coating device according to claim 18, wherein the drive mechanism further linearly shifts the substrate holder along the first longitudinal axis.

20. A vacuum coating device for coating substrates, by moving the substrates in a particle flow, comprising:
a substrate holder, a portion of which is positioned opposite the material source, wherein the substrate holder includes:
a first leg having a first longitudinal axis,
a second leg having a second longitudinal axis wherein the second leg extends from the first leg at an obtuse angle,
a third leg having a third longitudinal axis, wherein the third leg extends from the second leg,
a planet carrier mounted at an end of the third leg opposite the second leg, and
a plurality of substrate shafts extending from the planet carrier on which substrates may be mounted for coating,
wherein the planet carrier and substrate shafts are positioned such that the first longitudinal axis of the first leg approximately intersects a central area where the substrates are held; and
a drive mechanism for moving the substrate holder:
(a) said substrate holder being rotatable with respect to the first longitudinal axis,
(b) said substrate holder being shiftable along the first longitudinal axis,
(c) said planet carrier being rotatable with respect to the third longtudinal axis, and
(d) said substrate shafts being rotatable with respect to the planet carrier.

21. A method for vacuum coating of a substrate, comprising rotating the substrate in a particle flow, located in a vacuum chamber with a source of vaporizable material, positioning a holder for the substrate opposite said source of material, correlating movement of said substrate holder, to provide for rotation and shifting movement of the substrate,
wherein the substrate holder includes a first leg having a first longitudinal axis,
a second leg having a second logitudinal axis, wherein the first leg incloses an obtuse angle with the second leg,
a third leg having a third longitudinal axis, wherein the third leg extends from the second leg,
driving the substrate holder around the longitudinal axis of the first leg in a rotatable manner by a motor,
driving the substrate holder around the longitudinal axis of the second leg in a rotatable manner and
driving a planet carrier around the longitudinal axis of the third leg in a rotatable manner by a sun gear of a planetary gear system, wherein the free end of the hollow section of the third leg is provided with a gear-tooth system, with which a plurality of planet gears, supported on the sun gear and whose gear axes are firmly connected with the substrate holders, engage.

* * * * *